US011844198B2

(12) United States Patent
Liu

(10) Patent No.: US 11,844,198 B2
(45) Date of Patent: Dec. 12, 2023

(54) POWER MODULE

(71) Applicant: ZF Friedrichshafen AG, Friedrichshafen (DE)

(72) Inventor: Wei Liu, Friedrichshafen (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 162 days.

(21) Appl. No.: 17/557,735

(22) Filed: Dec. 21, 2021

(65) Prior Publication Data

US 2022/0201891 A1 Jun. 23, 2022

(30) Foreign Application Priority Data

Dec. 22, 2020 (DE) ...................... 10 2020 216 476.2

(51) Int. Cl.
*H05K 7/20* (2006.01)
*H05K 1/18* (2006.01)
*H05K 1/02* (2006.01)

(52) U.S. Cl.
CPC ........... *H05K 7/209* (2013.01); *H05K 1/0271* (2013.01); *H05K 1/181* (2013.01); *H05K 2201/068* (2013.01); *H05K 2201/10015* (2013.01); *H05K 2201/10166* (2013.01)

(58) Field of Classification Search
CPC ...... H05K 7/209; H05K 1/0271; H05K 1/181; H05K 2201/068; H05K 2201/10015; H05K 2201/10166
See application file for complete search history.

(56) References Cited

U.S. PATENT DOCUMENTS

| 2012/0020025 A1* | 1/2012 | Sotome | H01G 4/228 |
| | | | 361/704 |
| 2013/0146339 A1* | 6/2013 | Yano | H01L 23/49833 |
| | | | 29/829 |
| 2019/0258302 A1* | 8/2019 | Aoki | C09D 179/08 |

\* cited by examiner

*Primary Examiner* — Sherman Ng
(74) *Attorney, Agent, or Firm* — Dority & Manning, P.A.

(57) ABSTRACT

A power module includes at least one power semiconductor element between first and second conductive layers, a first cooling member on the first conductive layer, a second cooling member under the second conductive layer, and at least one snubber capacitor between the first and second conductive layers. Each snubber capacitor has a capacitor core between first and second electrodes and first and second transition layers. The first transition layer is between the first conductive layer and the first electrode and the second transition layer is between the second electrode and the second conductive layer, or the first transition layer is between the first electrode and the capacitor core and the second transition layer is between the capacitor core and the second electrode. The first and second transition layers are conductive. A thermal expansion coefficient of the transition layers is between thermal expansion coefficients of adjacent elements of the snubber capacitor.

26 Claims, 3 Drawing Sheets

POWER MODULE

CROSS-REFERENCE TO RELATED APPLICATION

The present application is related and has right of priority to German Patent Application No. 10 2020 216 476.2 filed on Dec. 22, 2020, the entirety of which is incorporated by reference for all purposes.

FIELD OF THE INVENTION

The invention relates generally to a power module, in particularly a power module with inner snubber capacitors.

BACKGROUND OF THE INVENTION

Power devices (wide bandgap (WBG) semiconductors, such as Silicon Carbide (SiC), Gallium Nitride (GaN)) are becoming more and more popular in applications where fast and efficient switching is required, such as power supply applications. In addition, the power devices are usually coupled with stray inductance of a power module package and surrounding circuits, and fast switching capability of the power devices causes a high instantaneous rate of change in voltage over time (dv/dt), which results in large surge voltage and Electromagnetic Interference (EMI) noise between drain and source terminals of the power devices when switching off.

In order to smooth the voltage surge and reduce the noise, a snubber capacitor Cc is added, as shown in FIG. 1. Referring to FIG. 2, two voltage waveforms with and without a snubber capacitor, respectively are illustrated. As shown by dashed line, the voltage surge is smoothed by the snubber capacitor. Thus, a snubber capacitor becomes an inevitable element in WBG semiconductor applications.

Now referring to FIG. 3, a traditional inverter design is shown as a block diagram. The inverter includes an AC connector 101, a DC connector 102, a power module 103 with multiple power devices 1031, such as WBG power devices, and a snubber capacitor 104 adjacent to the power module 103. The snubber capacitor 104 needs to be provided as close to the power devices 1031 as possible. In the traditional inverter, the snubber capacitor is only provided adjacent to part of the power devices, thus the smoothing effect of the snubber capacitor has been limited.

Moreover, a Multi-layer Ceramic Capacitor (MLCC) is commonly used in the traditional inverter design for its suitable capacitance value. A MLCC has two external electrodes and a capacitor core with dielectric and internal electrodes. Referring to FIG. 4, a MLCC 104 is soldered onto a copper pattern layer 114 by solder material 6 such that there is a gap 118 under the MLCC. A thermal resin 112 is provided between the copper pattern layer 114 and a Pin-Fin cooling member 110 (a person skilled in the art shall understand there is an insulative material between the copper pattern 114 and the cooling member 110, in this case, the thermal resin 112 is used as the insulative material). In this design, the heat generated by the MLCC 104 is only dissipated through the solder material 6 which results in an undesirable heat conduction efficiency. In some cases, the snubber capacitors are even burnt under bad thermal conditions.

SUMMARY OF THE INVENTION

In order to improve the thermal condition of the snubber capacitor and enhance the smoothing effect, a power module is disclosed. The power module includes a first conductive layer, a second conductive layer, at least one power semiconductor element between the first and second conductive layers, a first cooling member on the first conductive layer, a second cooling member under the second conductive layer, and at least one snubber capacitor between the first conductive layer and the second conductive layer. Each of the snubber capacitors has a first electrode, a second electrode, a capacitor core between the first and second electrodes, a first transition layer, and a second transition layer. The first transition layer and the second transition layer are conductive. The first transition layer is between the first conductive layer and the first electrode, and the second transition layer is similarly between the second electrode and the second conductive layer. A thermal expansion coefficient of the first transition layer is between a thermal expansion coefficient of the first conductive layer and a thermal expansion coefficient of the first electrode, and a thermal expansion coefficient of the second transition layer is between a thermal expansion coefficient of the second electrode and a thermal expansion coefficient of the second conductive layer. With this inner snubber capacitor design, voltage surge is smoothed. Additionally, overheating of the snubber capacitor is prevented since heat is dissipated from both cooling members. Furthermore, with the help of the transition layers, a thermal transition from the electrodes to the busbars is gradual enough to avoid an uneven distribution of stress, thus the snubber capacitor is well fixed.

According to another aspect of the invention, the power module, particularly each of the snubber capacitors, further has a third transition layer, the third transition layer being conductive, the third transition layer being between the first electrode and the capacitor core, and the thermal expansion coefficient of the third transition layer being between the thermal expansion coefficient of the first electrode and a thermal expansion coefficient of the capacitor core.

According to another aspect of the invention, the power module, particularly each of the snubber capacitors, further has a fourth transition layer, the fourth transition layer being conductive, the fourth transition layer being between the capacitor core and the second electrode, and the thermal expansion coefficient of the fourth transition layer being between a thermal expansion coefficient of the capacitor core and the thermal expansion coefficient of the second electrode.

According to another aspect of the invention, the third transition layer is a conductive resin layer, or the fourth transition layer is a conductive resin layer.

According to another aspect of the invention, the conductive resin layer is a resin layer doped with silver particles.

According to another aspect of the invention, the snubber capacitor is a MLCC.

According to another aspect of the invention, the first cooling member has a Pin-Fin structure, and/or, the second cooling member has a Pin-Fin structure.

According to another aspect of the invention, the first transition layer is soldered or sintered to the first conductive layer and the first electrode, and/or the second transition layer is soldered or sintered to the second electrode and the second conductive layer.

According to another aspect of the invention, the first transition layer is sintered to the first conductive layer and the first electrode by silver, and/or the second transition layer is sintered to the second electrode and the second conductive layer by silver.

According to another aspect of the invention, the power semiconductor element is a SiC metal-oxide-semiconductor field-effect transistor (MOSFET).

According to another aspect of the invention, the snubber capacitor is positioned adjacent to the power semiconductor element.

According to another aspect of the invention, an operating temperature of the power module is −40° C.~150° C. A voltage between the first conductive layer and the second conductive layer is 300V~800V. A current between the first conductive layer and the second conductive layer is 100 A~1000 A.

According to another aspect of the invention, another a power module is also disclosed. The power module includes a first conductive layer, a second conductive layer, at least one power semiconductor element between the first and second conductive layers, a first cooling member provided on the first conductive layer, a second cooling member under the second conductive layer, and at least one snubber capacitor between the first conductive layer and the second conductive layer. Each of the at least one snubber capacitor has a first electrode, a second electrode, a capacitor core between the first and second electrodes, a first transition layer, and a second transition layer. The first electrode is coupled to the first conductive layer and the second electrode is similarly coupled to the second conductive layer. The first transition layer is between the first electrode and the capacitor core, the second transition layer is between the capacitor core and the second electrode, a thermal expansion coefficient of the first transition layer is between a thermal expansion coefficient of the first electrode and a thermal expansion coefficient of the capacitor core, a thermal expansion coefficient of the second transition layer is between the thermal expansion coefficient of the capacitor core and a thermal expansion coefficient of the second electrode.

According to another aspect of the invention, the power module further, particularly each of the snubber capacitors, has a third transition layer, the third transition layer being conductive, the third transition layer being between the first conductive layer and the first electrode, and a thermal expansion coefficient of the third transition layer being between the thermal expansion coefficient of the first conductive layer and the thermal expansion coefficient of the first electrode.

According to another aspect of the invention, the power module, particularly each of the snubber capacitors, further has a fourth transition layer, the fourth transition layer being conductive, the fourth transition layer being between the second electrode and the second conductive layer, and a thermal expansion coefficient of the fourth transition layer being between the thermal expansion coefficient of the second electrode and the thermal expansion coefficient of the second conductive layer.

According to another aspect of the invention, the first transition layer is a conductive resin layer, or the second transition layer is a conductive resin layer.

According to another aspect of the invention, the conductive resin layer is a resin layer doped with silver particles.

According to another aspect of the invention, the snubber capacitor is a MLCC.

According to another aspect of the invention, the first cooling member has a Pin-Fin structure, and/or, the second cooling member has a Pin-Fin structure.

According to another aspect of the invention, the third transition layer is soldered or sintered to the first conductive layer and the first electrode, and/or the fourth transition layer is soldered or sintered to the second electrode and the second conductive layer.

According to another aspect of the invention, the third transition layer is sintered to the first conductive layer and the first electrode by silver, and/or the fourth transition layer is sintered to the second electrode and the second conductive layer by silver.

According to another aspect of the invention, the power semiconductor element is a SiC MOSFET.

According to another aspect of the invention, the snubber capacitor is positioned adjacent to the power semiconductor element.

According to another aspect of the invention, an operating temperature of the power module is −40° C.~150° C. A voltage between the first conductive layer and the second conductive layer is 300V~800V. A current between the first conductive layer and the second conductive layer is 100 A~1000 A.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by on skilled in the art without departing from the spirit and scope of the described embodiments.

DETAILED DESCRIPTION

Figure 1:
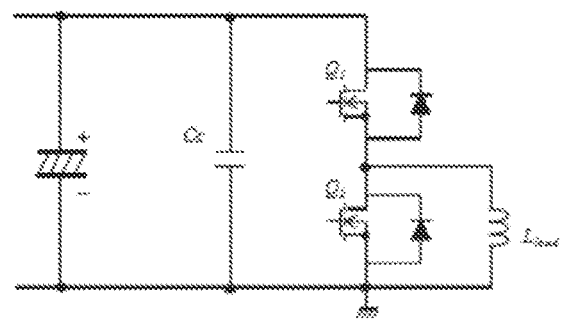
FIG. 1 illustrates a power supply circuit using power devices.
Figure 2:
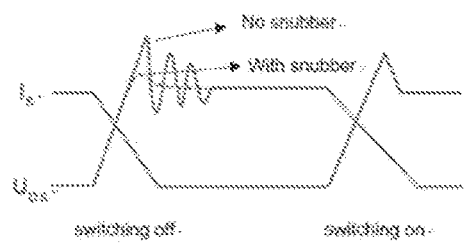
FIG. 2 illustrates two voltage waveforms with and without a snubber capacitor, respectively.
Figure 3:
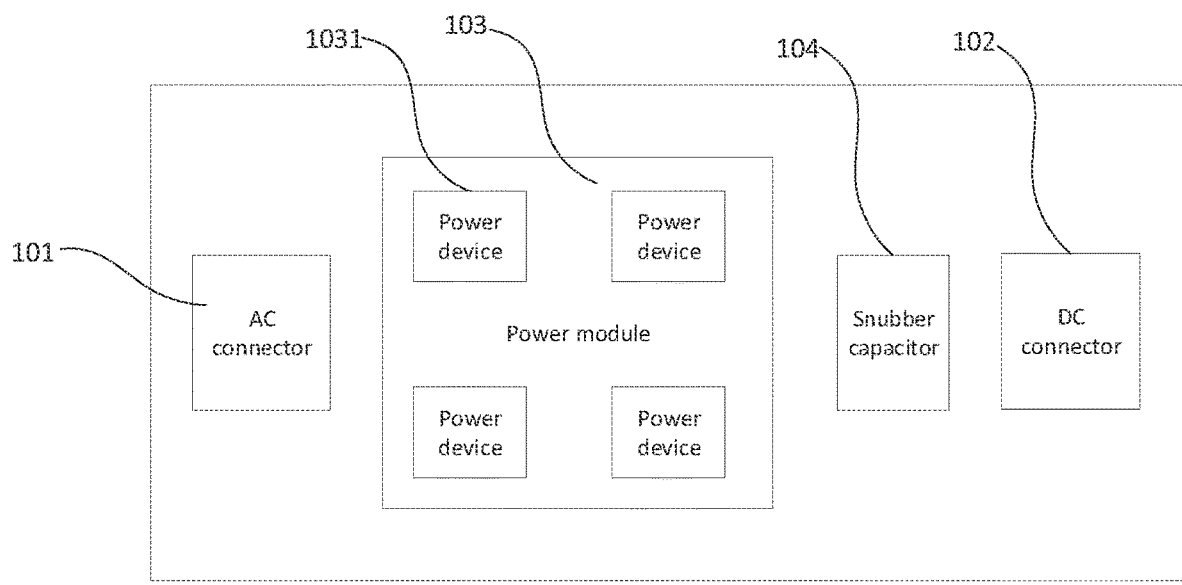
FIG. 3 illustrates a diagram of a traditional inverter with the snubber capacitor adjacent to the power module.
Figure 4:
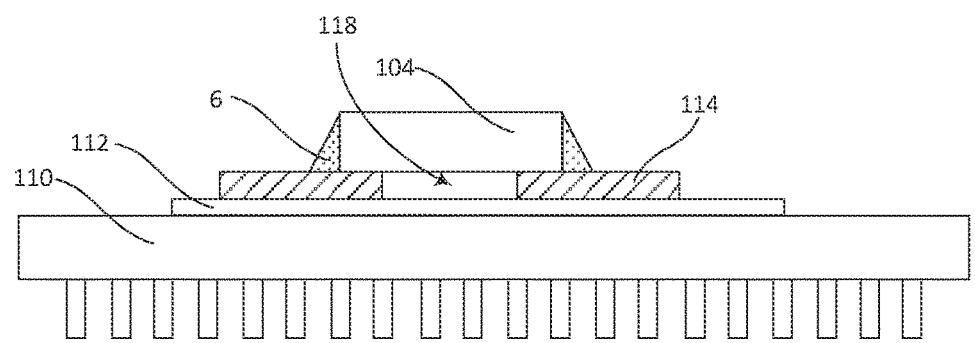
FIG. 4 illustrates a cross sectional view of a snubber capacitor arrangement with a Pin-Fin cooling member.

Reference will now be made to embodiments of the invention, one or more examples of which are shown in the drawings. Each embodiment is provided by way of explanation of the invention, and not as a limitation of the invention. For example, features illustrated or described as part of one embodiment can be combined with another embodiment to yield still another embodiment. It is intended that the present invention include these and other modifications and variations to the embodiments described herein.

Referring now to the drawings, embodiments of the invention are described in detailed. In this invention, the power modules of different embodiments are mainly used in the automotive industry where, unlike in PCB application, the operation conditions of power modules are much stricter. For example, in the automotive industry, the operating temperature of the power modules is −40° C.~150° C., the voltage between the first conductive layer and the second conductive layer is 300V~800V, and/or the current between the first conductive layer and the second conductive layer is 100 A~1000 A. Thus, to meet the above demands, influence of temperature on the capacitors must be taken into consideration.

Figure 5:
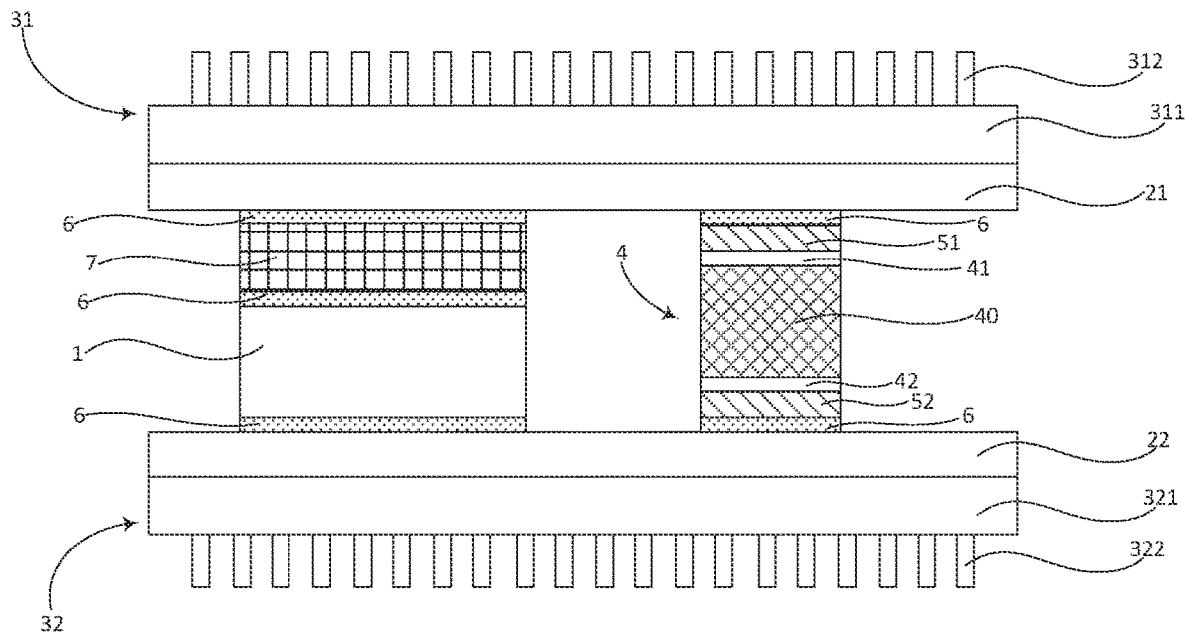
FIG. 5 illustrates a cross sectional view of a power module in accordance with a first embodiment of the invention.

First referring to FIG. 5, a power module in accordance with the first embodiment of the invention is disclosed. The power module has at least one power semiconductor element 1, such as a SiC device, a first conductive layer 21 and a second conductive layer 22 configured to sandwich the power semiconductor element 1 therebetween. The power module further includes a first cooling member 31 provided on the first conductive layer 21 and a second cooling member 32 provided under the second conductive layer 22. The first conductive layer 21 and second conductive layer 22 are coupled to a first busbar and a second busbar, respectively, of an inverter where said inverter includes the power module. Both the first cooling member 31 and the second cooling member 32 have a Pin-Fin structure. A skilled person shall understand the cooling members 31, 32 are insulative to the conductive layers 21, 22 by insulative materials (not shown) therebetween, respectively. Each of the Pin-Fin structures 31, 32 has a baseplate 311, 321 and Fins 312, 322 on the baseplate 311, 321, respectively. The power semiconductor element 1 is soldered to the first conductive layer 21 and the second conductive layer 22 by solder material 6. Normally the power semiconductor element 1 is very thin, and a gasket 7 is provided on the power semiconductor element 1 to prevent the power semiconductor element 1 from short circuits between electrodes.

The power module further includes at least one snubber capacitor 4 between the first conductive layer 21 and the second conductive layer 22. The snubber capacitor 4 has a first electrode 41, a second electrode 42 and a capacitor core 40 therebetween. The snubber capacitor 4 is a MLCC and is provided adjacent to the power semiconductor element 1 such that voltage surges during power semiconductor elements switching on and off is smoothed.

The snubber capacitor 4 is soldered to the first conductive layer 21 and the second conductive layer 22 by solder material 6, with the first electrode 41 coupled to the first conductive layer 21 and the second electrode 42 coupled to the second conductive layer 22. Normally the material of the electrode 41, 42 is different from that of two busbars, and thus uneven distribution of stress caused by different thermal expansion coefficients exist and the snubber capacitor 4 might get loosed after alternating heating and cooling caused by power semiconductor elements switching on and off. In view of this, the power module further has a first transition layer 51 and a second transition layer 52, both of which are conductive. The first transition layer 51 is between the first conductive layer 21 and the first electrode 41, while the second transition layer 52 is between the second electrode 42 and the second conductive layer 22. The thermal expansion coefficient of the first transition layer 51 is between that of the first conductive layer 21 and that of the first electrode 41, and the thermal expansion coefficient of the second transition layer 52 is between that of the second electrode 42 and that of the second conductive layer 22. The first transition layer 51 is soldered to the first conductive layer 21 and the first electrode 41 by solder material 6, and the second transition layer 52 is soldered to the second electrode 42 and the second conductive layer 22 by solder material 6 (in FIG. 5, only solder material 6 coupling transition layers and busbars are shown). Briefly, these two transition layers 51, 52 provide a gradual thermal transition from the electrodes 41, 42 to the busbars and avoid an uneven distribution of stress, and thus the snubber capacitor 4 is well fixed.

Other than being soldered with solder material 6, both the first transition layer 51 and the second transition layer 52 are optionally sintered to the conductive layers 21, 22 and the electrodes 41, 42, such as by silver sintering.

Figure 6:
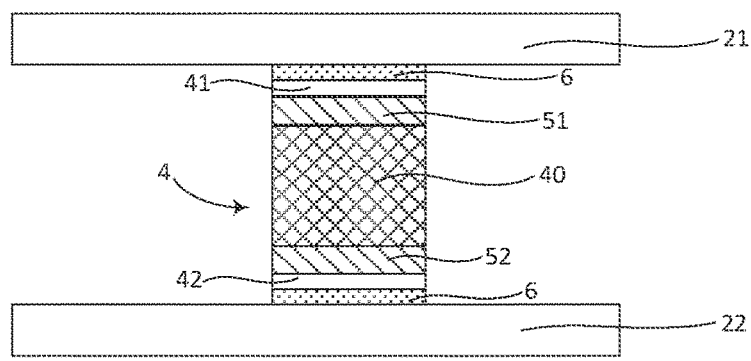
FIG. 6 illustrates a cross sectional view of a power module in accordance with a second embodiment of the invention in which only the snubber capacitor is shown.

Now referring to FIG. 6, a cross sectional view of a power module in accordance with the second embodiment of the invention is shown. In this embodiment, the arrangement of the power semiconductor element is the same as that in the first embodiment, thus only the snubber capacitor 4 is shown and the power semiconductor element 1 (FIG. 5) and two cooling members 31, 32 (FIG. 5) are omitted. As shown in FIG. 6, the first electrode 41 of the snubber capacitor 4 is coupled to the first conductive layer 21 by the solder material 6 and the second electrode 42 of the snubber capacitor 4 is coupled to the second conductive layer 22 in the same way. What differs from the first embodiment is the arrangement of the first transition layer 51 and the second transition layer 52. In FIG. 6, the first transition layer 51 is between the first electrode 41 and the capacitor core 40, and the second transition layer 52 is between the capacitor core 40 and the second electrode 42. The thermal expansion coefficient of the first transition layer 51 is between that of the first electrode 41 and that of the capacitor core 40, and the thermal expansion coefficient of the second transition layer 52 is between that of the capacitor core 40 and that of the second electrode 42. With this design, uneven distribution of stress in the snubber capacitor 4 due to the different thermal effect is avoided, thus the life span of the snubber capacitor 4 is extended.

The first transition layer 51 and the second transition layer 52 are conductive resin layers, in particular, resin layers doped with silver particles.

Figure 7:
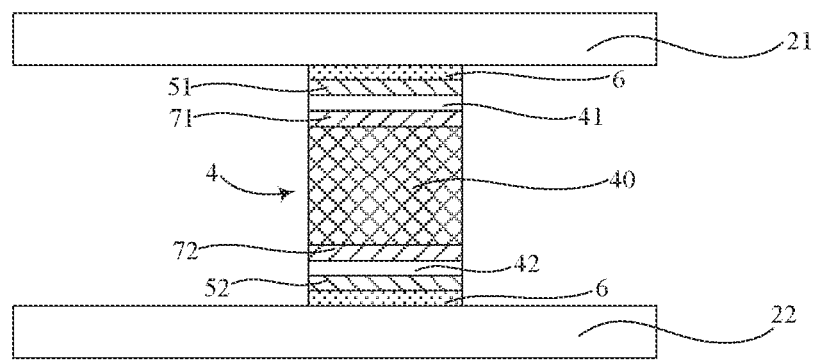
FIG. 7 illustrates a cross sectional view of a power module in accordance with a third embodiment of the invention in which only the snubber capacitor is shown.

Now referring to FIG. 7, a cross sectional view of a power module in accordance with the third embodiment of the invention in which only the snubber capacitor is shown. The basic arrangement of the snubber capacitor 4 is the same as that in the first embodiment, except that the power module further has a third transition layer 71 and a fourth transition layer 72. The third transition layer 71 is a conductive layer between the first electrode 41 and the capacitor core 40. The thermal expansion coefficient of the third transition layer 71 is between that of the first electrode 41 and that of the capacitor core 40. The fourth transition layer 72 is a conductive layer between the capacitor core 40 and the second electrode 42. The thermal expansion coefficient of the fourth transition layer 72 is between that of the capacitor core 40 and that of the second electrode 42. Similarly, the arrangement of the third transition layer 71 and the fourth transition layer 72 further improves the thermal effect of the snubber capacitor 4.

Figure 8:
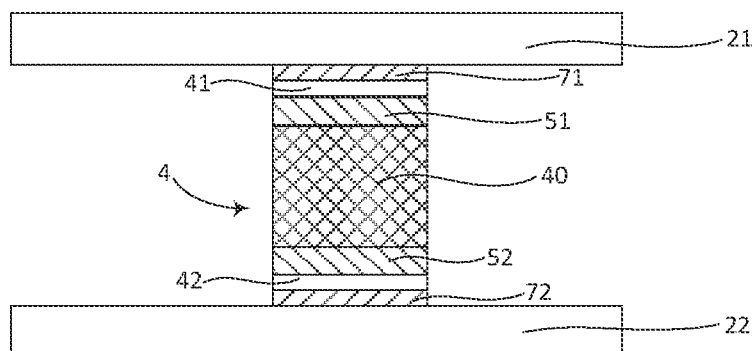
FIG. 8 illustrates a cross sectional view of a power module in accordance with a fourth embodiment of the invention in which only the snubber capacitor is shown.

Now referring to FIG. 8, a cross sectional view of a power module in accordance with the fourth embodiment of the invention in which only the snubber capacitor 4 is shown. The basic arrangement of the snubber capacitor 4 is the same as that in the second embodiment, except that the power module further includes a third transition layer 71 and a fourth transition layer 72. The third transition layer 71 is a conductive layer between the first conductive layer 21 and the first electrode 41. The thermal expansion coefficient of the third transition layer 71 is between that of the first conductive layer 21 and that of the first electrode 41. The fourth transition layer 72 is a conductive layer between the second electrode 42 and the second conductive layer 22. The thermal expansion coefficient of the fourth transition layer 72 is between that of the second electrode 42 and that of the second conductive layer 22. In this embodiment, the third transition layer 71 is sintered to the first conductive layer 21 and the first electrode 41, while the fourth transition layer 72 is sintered to the second conductive layer 22 and the second electrode 42. The arrangement of the third transition layer 71 and the fourth transition layer 72 further improves the thermal effect between the snubber capacitor 4 and the busbars and prevents the snubber capacitor 4 from being loosed due to the uneven distribution of stress.

Additionally, in another preferred embodiment, either the third transition layer 71 or the fourth transition layer 72 is omitted. For example, the third transition layer 71 is omitted and the first conductive layer 21 is directly coupled to the first electrode 41. In such case, the first conductive layer 21 is ultrasonically soldered to the first electrode 41. In another preferred embodiment, one snubber capacitor 4 corresponds to more than one power semiconductor elements to smooth the voltage surge.

A number of alternative structural elements and processing steps have been suggested for the preferred embodiment. Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

Modifications and variations can be made to the embodiments illustrated or described herein without departing from the scope and spirit of the invention as set forth in the appended claims. In the claims, reference characters corresponding to elements recited in the detailed description and the drawings may be recited. Such reference characters are enclosed within parentheses and are provided as an aid for reference to example embodiments described in the detailed description and the drawings. Such reference characters are provided for convenience only and have no effect on the scope of the claims. In particular, such reference characters are not intended to limit the claims to the particular example embodiments described in the detailed description and the drawings.

I claim:

1. A power module comprising:
a first conductive layer;
a second conductive layer;
at least one power semiconductor element between the first and second conductive layers;
a first cooling member on the first conductive layer;
a second cooling member under the second conductive layer; and
at least one snubber capacitor between the first and second conductive layers, each of the at least one snubber capacitor comprising:
a first electrode;
a second electrode;
a capacitor core between the first and second electrodes;
a first transition layer between the first conductive layer and the first electrode; and
a second transition layer between the second electrode and the second conductive layer,
wherein the first transition layer and the second transition layer are conductive,
wherein a thermal expansion coefficient of the first transition layer is between a thermal expansion coefficient of the first conductive layer and a thermal expansion coefficient of the first electrode, and
wherein a thermal expansion coefficient of the second transition layer is between a thermal expansion coefficient of the second electrode and a thermal expansion coefficient of the second conductive layer.

2. The power module of claim 1, wherein each of the at least one snubber capacitor further comprises a further transition layer, the further transition layer being conductive, the further transition layer being between the capacitor core and one of the first electrode and the second electrode, and a thermal expansion coefficient of the further transition layer being between a thermal expansion coefficient of the capacitor core and the thermal expansion coefficient of the one of the first electrode and the second electrode.

3. The power module of claim 2, wherein the further transition layer is a conductive resin layer.

4. The power module of claim 3, wherein the conductive resin layer is doped with silver particles.

5. The power module of claim 2, wherein each of the at least one snubber capacitor further comprises an additional transition layer, the additional transition layer being conductive, the additional transition layer being between the capacitor core and another of the one of the first electrode and the second electrode, and a thermal expansion coefficient of the additional transition layer being between a thermal expansion coefficient of the capacitor core and the thermal expansion coefficient of the other of the first electrode and the second electrode.

6. The power module of claim 1, wherein the snubber capacitor is a multi-layer ceramic capacitor (MLCC).

7. The power module of claim 1, wherein one or both of the first cooling member and the second cooling member has a Pin-Fin structure.

8. The power module of claim 1, wherein one or both of:
the first transition layer is soldered or sintered to the first conductive layer and the first electrode; and
the second transition layer is soldered or sintered to the second electrode and the second conductive layer.

9. The power module of claim 8, wherein one or both of:
the first transition layer is ultrasonically soldered to the first conductive layer and the first electrode; and
the second transition layer is ultrasonically soldered to the second electrode and the second conductive layer.

10. The power module of claim 8, wherein one or both of:
the first transition layer is sintered to the first conductive layer and the first electrode by silver; and
the second transition layer is sintered to the second electrode and the second conductive layer by silver.

11. The power module of claim 1, wherein the power semiconductor element is a Silicon Carbide (SiC) metal-oxide-semiconductor field-effect transistor (MOSFET).

12. The power module of claim 1, wherein the snubber capacitor is adjacent to the power semiconductor element.

13. The power module of claim 1, wherein one or more of:
an operating temperature of the power module is between −40° C. and 150° C.;
a voltage between the first conductive layer and the second conductive layer is between 300V and 800V; and a current between the first conductive layer and the second conductive layer is between 100 A and 1000 A.

14. A power module comprising:
a first conductive layer;
a second conductive layer;
at least one power semiconductor element between the first and second conductive layers;
a first cooling member on the first conductive layer;
a second cooling member under the second conductive layer; and
at least one snubber capacitor between the first and second conductive layers, each of the at least one snubber capacitor comprising:
 a first electrode coupled to the first conductive layer;
 a second electrode coupled to the second conductive layer;
 a capacitor core between the first and second electrodes;
 a first transition layer between the first electrode and the capacitor core; and
 a second transition layer between the capacitor core and the second electrode,
 wherein a thermal expansion coefficient of the first transition layer is between a thermal expansion coefficient of the first electrode and a thermal expansion coefficient of the capacitor core, and
 wherein a thermal expansion coefficient of the second transition layer is between the thermal expansion coefficient of the capacitor core and a thermal expansion coefficient of the second electrode.

15. The power module of claim 14, wherein each of the at least one snubber capacitor further comprises a further transition layer, the further transition layer being conductive, the further transition layer being between one of the first conductive layer and the second conductive layer and an adjacent one of the first electrode and the second electrode adjacent to the one of the first conductive layer and the second conductive layer, and a thermal expansion coefficient of the further transition layer being between a thermal expansion coefficient of the one of the first conductive layer and the second conductive layer and the thermal expansion coefficient of the adjacent one of the first electrode and the second electrode.

16. The power module of claim 15, wherein the further transition layer is soldered or sintered to the one of the first conductive layer and the second conductive layer and to the adjacent one of the first electrode and the second electrode.

17. The power module of claim 16, wherein the further transition layer is ultrasonically soldered to the one of the first conductive layer and the second conductive layer and to the adjacent one of the first electrode and the second electrode.

18. The power module of claim 16, wherein the further transition layer is sintered by silver to the one of the first conductive layer and the second conductive layer and to the adjacent one of the first electrode and the second electrode.

19. The power module of claim 15, further comprising an additional transition layer, the additional transition layer being conductive, the additional transition layer being between another of the first electrode and the second electrode and a respective adjacent one of the first conductive layer and the second conductive layer adjacent to the other of the first electrode and the second electrode, and a thermal expansion coefficient of the additional transition layer being between the thermal expansion coefficient of the other of the first electrode and the second electrode and a thermal expansion coefficient of the respective adjacent one of the first conductive layer and the second conductive layer.

20. The power module of claim 14, wherein one or both of the first transition layer and the second transition layer is a conductive resin layer.

21. The power module of claim 20, wherein the conductive resin layer is doped with silver particles.

22. The power module of claim 14, wherein the snubber capacitor is a multi-layer ceramic capacitor (MLCC).

23. The power module of claim 14, wherein one or both of the first cooling member and the second cooling member has a Pin-Fin structure.

24. The power module of claim 14, wherein the power semiconductor element is a Silicon Carbide (SiC) metal-oxide-semiconductor field-effect transistor (MOSFET).

25. The power module of claim 14, wherein the snubber capacitor is adjacent to the power semiconductor element.

26. The power module of claim 14, wherein one or more of:
an operating temperature of the power module is between −40° C. and 150° C.;
a voltage between the first conductive layer and the second conductive layer is between 300V and 800V; and
a current between the first conductive layer and the second conductive layer is between 100 A and 1000 A.

* * * * *